(12) United States Patent
Santin

(10) Patent No.: US 11,143,729 B2
(45) Date of Patent: Oct. 12, 2021

(54) OPTIMISED GENERATION OF MRI IMAGES BY A MULTI-ANTENNA MRI SYSTEM

(71) Applicants: INSTITUT DU CERVEAU ET DE LA MOELLE EPINIERE (ICM), Paris (FR); CENTRE NATIONAL DE LA RECHERCHE SCIENTIFIQUE (CNRS), Paris (FR); INSTITUT NATIONAL DE LA SANTE ET DE LA RECHERCHE MEDICALE (INSERM), Paris (FR); ASSISTANCE PUBLIQUE-HÔPITAUX DE PARIS (AP-HP), Paris (FR); SORBONNE UNIVERSITE, Paris (FR)

(72) Inventor: Mathieu Santin, La Rochette (FR)

(73) Assignees: INSTITUT DU CERVEAU ET DE LA MOELLE EPINIERE (ICM), Paris (FR); CENTRE NATIONAL DE LA RECHERCHE SCIENTIFIQUE (CNRS), Paris (FR); INSTITUT NATIONAL DE LA SANTE ET DE LA RECHERCHE MEDICALE (INSERM), Paris (FR); ASSISTANCE PUBLIQUE—HOPITAUX DE PARIS (AP-HP), Paris (FR); SORBONNE UNIVERSITE, Paris (FR)

(*) Notice: Subject to any disclaimer, the term of this patent is extended or adjusted under 35 U.S.C. 154(b) by 0 days.

(21) Appl. No.: 16/757,035

(22) PCT Filed: Oct. 15, 2018

(86) PCT No.: PCT/FR2018/052552
§ 371 (c)(1),
(2) Date: Aug. 4, 2020

(87) PCT Pub. No.: WO2019/077246
PCT Pub. Date: Apr. 25, 2019

(65) Prior Publication Data
US 2021/0072334 A1   Mar. 11, 2021

(30) Foreign Application Priority Data
Oct. 18, 2017   (FR) ........................................ 1759804

(51) Int. Cl.
*G01R 33/561* (2006.01)
*G01R 33/56* (2006.01)
*G01R 33/565* (2006.01)

(52) U.S. Cl.
CPC ...... *G01R 33/5611* (2013.01); *G01R 33/5608* (2013.01); *G01R 33/5659* (2013.01)

(58) Field of Classification Search
CPC ............ G01R 33/5608; G01R 33/5611; G01R 33/5659
See application file for complete search history.

(56) References Cited

U.S. PATENT DOCUMENTS 7,141,971 B2   11/2006 Duensing et al.
2010/0202709 A1*  8/2010 Heavens ................... G06T 7/35
                                                     382/248

(Continued)

OTHER PUBLICATIONS

Hansen et al: "Image reconstruction: An overview for clinicians" Journal of Magnetic Resonance Imaging, vol. 41, No. 3, pp. 573-585, 2015.

*Primary Examiner* — Gregory H Curran
(74) *Attorney, Agent, or Firm* — W&C IP

(57) ABSTRACT

The present invention improves the quality of the magnitude and phase images produced in medical imaging, in particular in the case of multi-antenna MRI. The invention proposes to generate (28) such an image (I) by summing the complex image data $(p_j, \tilde{p}_j)$ obtained from different antennas by weighting these data using only the diagonal elements $(R_{j,j})$ (Continued)

of an antenna noise covariance matrix or its inverse or pseudo-inverse matrix ($R_{j,j}^{-1}$). A reference antenna (Ref) may be determined (24), so as to be able to replace (26), in each of these datum, a phase component specific to the acquisition antenna by a reference phase component. The reference antenna is preferably a virtual antenna formed by linear combination of the antennas of the MRI system. If significant improvements are obtained in the phase image resulting from the summation, a very clear gain is also surprisingly obtained in the magnitude image.

10 Claims, 2 Drawing Sheets

(56) References Cited

U.S. PATENT DOCUMENTS

| | | |
|---|---|---|
| 2012/0092009 A1 | 4/2012 | Zhang et al. |
| 2013/0076352 A1 | 3/2013 | Block et al. |
| 2016/0025833 A1* | 1/2016 | Polimeni ............ G01R 33/5608 324/309 |

* cited by examiner

OPTIMISED GENERATION OF MRI IMAGES BY A MULTI-ANTENNA MRI SYSTEM

The present invention generally relates to the field of medical imaging and particularly imaging by nuclear resonance magnetic imaging or MRI. The present invention aims to improve the quality of the images in magnitude and phase obtained by an MRI system comprising a plurality of radio frequency (RF) receiving antennas.

BACKGROUND TO THE INVENTION

MRI is based on the principle of nuclear magnetic resonance (NMR) which uses the quantum properties of atomic nuclei. MRI requires a strong and stable magnetic field produced by a superconducting magnet that creates tissue magnetization by aligning spin magnetic moments. Weaker oscillating magnetic fields, referred to as "radio frequency", are then applied so as to slightly modify this alignment. The return to equilibrium, denoted relaxation, gives rise to a radiofrequency signal that is measurable by an antenna.

The specificity of MRI consists in precisely locating in space the origin of this NMR signal by applying non-uniform magnetic fields called "gradients", which induce slightly different precession frequencies as a function of the position of the atoms in these gradients.

The magnetic fields detected by the antenna are acquired so as to form an image with complex values in the frequency domain, otherwise called k-space data. Document US 2013/076352 discloses the selection of a sub-sampling scheme for MRI imaging.

An inverse Fourier transform applied to k-space data makes it possible to constitute complex image data in the spatial domain, i.e. data with complex values, of an anatomical area of a subject. This image data may correspond to a two-dimensional (or "slice") or volume (i.e. three-dimensional) image.

A magnitude image, formed from the modules of complex values in each pixel of the image data obtained, is traditionally used because it has a maximum signal-to-noise ratio.

A phase image, formed from the arguments of the complex values in each pixel of the image data obtained, may also be used to measure velocities and flow rates, for example of blood, or to provide information on the macroscopic variations of the magnetic field.

MRI systems using several antennas or antenna elements have been developed, making it possible to explore a large area of interest, and providing an improved signal-to-noise ratio compared to single-antenna systems. Such multi-antenna MRI systems are formed by a set of several surface antennas, arranged, for example, side by side. Each antenna has its own radio frequency signal reception channel and produces an image of the anatomical region next to which it is located. The different images obtained in the spatial domain are then combined by computer algorithms to form a terminal image. A classic combination of images is based on the technique known as the Sum of Squares (SoS).

The document "Image Reconstruction: An Overview for Clinicians" (Michael S. Hansen et al., Journal of Magnetic Resonance Imaging 41: 537-585, 2015) gives an overview of reconstruction techniques in MRI imaging.

The present invention aims to improve known techniques for obtaining better quality magnitude and/or phase images, i.e. having an improved signal-to-noise ratio and/or with fewer artifacts.

SUMMARY OF THE INVENTION

In this context, the invention provides a method of generating an image of a subject using a nuclear magnetic resonance imaging system, MRI, comprising a plurality of radiofrequency receiving antennas, wherein the method comprises the following steps:
 obtaining complex data (i.e. with complex values) of the subject image using each antenna (at a given acquisition time),
 obtaining a noise covariance matrix of said antennas. In practice, the covariance matrix has non-diagonal coefficients that are non-zero, and
 generating an image of the subject by summing the complex image data obtained using different antennas by weighting this complex image data by using only the diagonal elements of the covariance matrix obtained, or of its inverse, or pseudo-inverse, matrix. In particular, each complex image datum is weighted by the diagonal element of the covariance matrix or of its inverse, or pseudo-inverse, matrix corresponding to the antenna with the help of which said complex data is obtained.

The inventor has found that this operation of linear combination of the images only weighted by the diagonal elements of the matrix, or (pseudo) inverse covariance, matrix (and therefore without using the non-diagonal elements which are in practice non-zero), simplifies the algorithms for combining the images acquired by the antennas, while enhancing the quality of the phase and, surprisingly, magnitude images, thus composed.

Correlatively, the invention also relates to a nuclear magnetic resonance imaging system, MRI, comprising a plurality of radio frequency receiving antennas and at least one processor that is configured for:
 obtaining complex data from the subject image by using each antenna,
 obtaining a noise covariance matrix of said antennas, comprising one or more non-zero, non-diagonal coefficients, and
 generating a subject image by summing the complex image data obtained using different antennas and by weighting this complex image data using only the diagonal elements of the covariance matrix obtained, or of its inverse or pseudo-inverse matrix. In particular, each complex image datum is weighted by the diagonal element of the covariance matrix, or of its inverse or pseudo-inverse matrix, corresponding to the antenna with the help of which said complex datum is obtained.

The MRI system offers advantages similar to those of the above method.

According to a particular embodiment, the method further comprises the following steps:
 determining a reference antenna, and
 replacing, in each complex image datum obtained using an antenna, a phase component specific to the antenna by a phase component of the reference antenna at the same spatial position as the complex image datum.

This configuration enables the influence of the antenna's own sensitivity to be eliminated in the final combination of the image data used to generate the subject's image.

According to a particular characteristic, the reference antenna is one of the antennas which is sensitive over the whole of a volume of interest formed by the subject. This approach simplifies the processing required to remove the specific sensitivity of each antenna within the various data obtained.

According to a variant, the reference antenna is a virtual antenna formed by linear combination of said antennas of the MRI system. This overcomes the problem of the absence of an antenna having sensitivity over the entire volume of interest.

In this case, the determination by linear combination may comprise a correction of the phases of the complex image data obtained. This makes it possible to avoid or limit a loss of signal-to-noise ratio in the development and use of the virtual reference antenna.

This correction of the complex image data obtained with the aid of an antenna may be carried out independently of the other antennas, by means of weighting coefficients of the antennas chosen in an appropriate manner, i.e. on the basis of complex image data obtained using said antenna only.

The correction may be carried out by subtracting, from the complex image data obtained with the help one antenna, the phase from the sum of the complex image data obtained using said antenna (for the same acquisition instant). This correction is simpler than that referenced in the Parker publication. It allows an overall reduction of phase noise in the data, and thus transcribes the coherent phase of the subject's explored tissue. The inventor found that, thanks to this correction of the phases of the images, the situations involving false estimation of the reference antenna in the application of the above-mentioned Parker publication, disappeared. The images of the subject generated by the invention are therefore generally of better quality.

Alternatively, it may be achieved by subtracting from the complex image data obtained using an antenna, a predetermined phase value so that the complex image data obtained using several, or even all, of the antennas have the same phase value (preferably zero) in the same pixel. This predetermined value may be calculated for each antenna, corresponding, for example, to the phase obtained by this antenna in said pixel (or spatial point of the observed area). Preferably, this pixel or spatial point may be chosen in an area of maximum overlap between the antennas. Several points may be chosen in the case where all the antennas do not have a common overlap.

According to an optional characteristic of the invention, the linear combination comprises a weighting of the complex image data corrected as a function of the magnitude of the set of complex data (for example, a weighting by the inverse of the sum of the modules of this complex data). This allows, in particular, normalization of the various images acquired among them.

In another particular embodiment, the replacement step comprises applying a low-pass filter to a phase difference between a complex image datum obtained using an antenna and a corresponding complex datum (i.e. with the same coordinates), obtained for the reference antenna, and the subtraction of this filtered phase difference from the phase of the complex image datum obtained using the antenna. The image data obtained for the virtual reference antenna may correspond to the aforementioned linear combination applied to the image data obtained with the help of the various antennas mentioned in this linear combination.

In practice, this subtraction may be achieved by multiplying the complex image data obtained by the antenna 'j' in each pixel (x,y,z) by $\exp(-i \cdot \langle \delta j(x,y,z) \rangle)$ where $\langle \delta j(x,y,z) \rangle$ is said filtered phase difference at point (x,y,z) for the antenna j.

According to one embodiment, the image of the subject generated is a magnitude image or a phase image or an image with complex values.

BRIEF DESCRIPTION OF FIGURES

Other features and advantages of the invention will become apparent from the following description, illustrated by the attached drawings, in which.

DETAILED DESCRIPTION OF THE EMBODIMENTS

Figure 1:
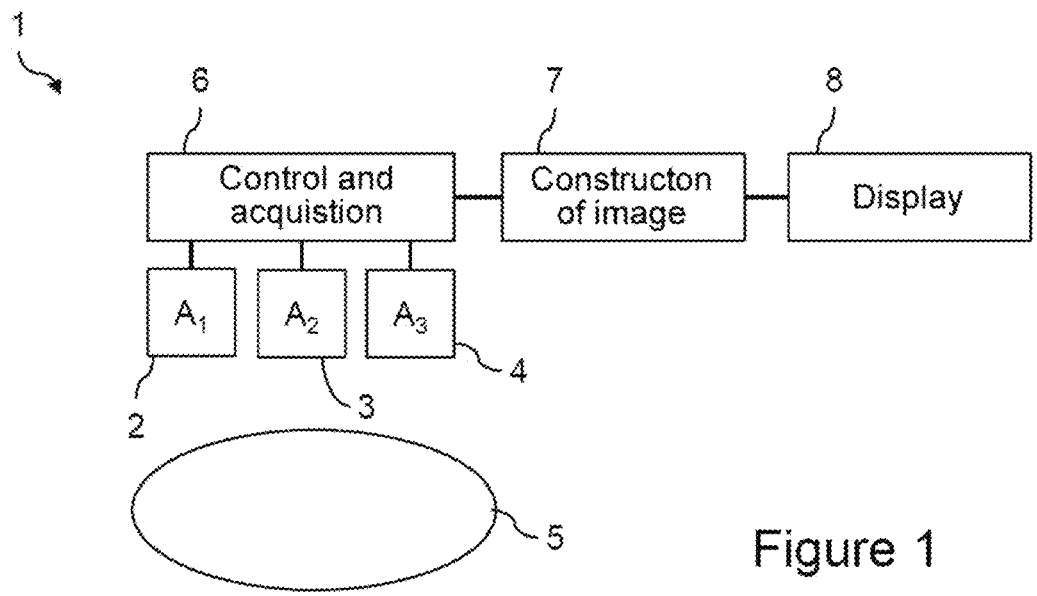
FIG. 1 schematically illustrates a multi-antenna MRI system 1 in which the present invention may be implemented.

The present invention is concerned with improving the quality of the images generated by a multi-antenna nuclear magnetic resonance imaging (MRI) system, typically by a spin echo or gradient echo sequence. In such a system, the radiofrequency signal measured by an antenna allows the acquisition, slice by slice, of images in the frequency space, generally the k-space data.

These k-space data correspond to a vector representing the magnetic field measured by the measurement antenna in each pixel or voxel of the area observed, in response to an excitation sequence emitted by the MRI system. These k-space data are complex in that their values in each pixel or voxel are complex values.

An inverse Fourier transform of this signal (k-space data) makes it possible to obtain data, also complex, in the spatial domain for the measurement antenna. So these are spatial images.

Several sets of spatial images (complex spatial data) are thus obtained by the multiple antennas of the MRI system.

For the purpose of simplification of the explanations, reference will be made hereafter only to complex spatial data (or complex spatial images) obtained by the antennas. Obviously, to obtain them requires the acquisition of k-space data, and the application of an inverse Fourier transform as mentioned above.

Complex spatial data (two-dimensional or volumetric, i.e. three-dimensional) obtained via multiple antennas or antenna elements in an area or volume of interest, typically an anatomical area of a patient subject, are combined to form a single spatial image (2D or 3D), which is generally used by the practitioner. We are talking here of the construction of an image.

Because the spatial data is complex, this combination makes it possible to construct two types of images.

On the one hand, the magnitude image is formed from the modules of complex spatial data resulting from the combination in each pixel/voxels. In most medical applications, this magnitude image is used.

Many techniques are known which aim to improve the quality of the image in magnitude, for example by enhancing the contrast.

On the other hand, the phase image is formed from the arguments of complex spatial data from the same combination in the pixel/voxel. The use of the phase image is more recent. It makes it possible, in particular, to analyze the blood flow rates in an anatomical area of interest, or to focus on the local variations of the magnetic field carried by the phase.

Some techniques have been developed to improve the quality of the phase image. The publication "Phase Reconstruction from Multiple Coil Data Using a Virtual Reference Coil" is known in particular (Parker et al., Magnetic Resonance in Medicine 72: 563-569, 2014).

This publication proposes the determination from multi-antenna measurements of an absolute phase relating to the area of interest explored. This determination involves the creation of a virtual reference antenna, the replacement of the phase component specific to each antenna by a phase component of the reference antenna within each spatial image (therefore in the complex spatial data), then the use of an inverse noise covariance matrix between the antennas to combine these previously re-phased images on the virtual reference antenna.

The virtual reference antenna is formed by simple combination of the physical antennas of the MRI system weighted by complex weights, so as to exhibit sensitivity over the entire area of interest.

The re-phasing on the reference antenna is effected by applying a low-pass filter to the phase difference between the non-re-phased image and a generated image corresponding to the reference antenna, then by subtraction of this filtered phase difference from the phase of the image not yet re-phased. This re-phasing ensures that the phase specific to each antenna has been replaced by the same reference phase, while retaining the magnetization phase that one wishes to observe, and the noise phase. The influence of the antenna sensitivity is thus reduced or even eliminated in these re-phased images.

The present invention takes advantage of an unexpected technical effect of improving the quality of the generated magnitude and/or phase images resulting from a choice made by the inventor when combining complex spatial images into a single image.

The invention provides a summation of the complex image data (in the spatial domain) obtained using different antennas, by weighting this complex image data using only the diagonal elements of the covariance matrix, or of its inverse or pseudo-inverse matrix (for example if the covariance matrix is not reversible), preferably the diagonal element corresponding to the antenna from which each complex data image in question is obtained. The invention thus does not provide for a complex combination using all the elements of the antenna inverse noise covariance matrix, as in the publication by Parker et al. mentioned above, wherein it should be recalled that, in practice, the covariance matrix is not diagonal and includes one, or even several, non-diagonal non-zero coefficients. The approach according to the invention thus reduces the computational complexity during the generation of the final image of the observed subject.

As will be described later, this simplified summation may be applied to the algorithm described in Parker et al. or improved versions of it. Although this algorithm is only interested in improving the phase image, it is surprisingly observed that the simplified summation provided by the invention substantially improves the quality of the magnitude image.

FIG. 1 illustrates schematically a multi-antenna MRI system 1 in which the present invention may be implemented.

Conventionally, a multi-antenna MRI system 1 comprises a plurality of radio frequency receiving antennas (or antenna elements) Aj 2, 3, 4 arranged close to the area or volume of interest, generally an anatomical area of a patient subject 5. Although only three antennas are shown in the Figure, the MRI system 1 may include two or more such antennas. One may, for example, count 64 antennas distributed near the volume of interest.

The antennas may be of the surface or volume type (surrounding a tunnel in which the area of interest is located), arranged side by side (phased array) or, according to different arrangements, may be receivers only or transmitter-receivers.

Preferably, the antennas all have a volume/measurement area which includes the volume/area of interest. The invention also applies to an array of antennas which do not entirely overlap the area of interest (some antennas measuring part of the area of interest and others not, and vice versa for another part of the area of interest).

An antenna control module 6 allows the acquisition of raw complex data, referred to as k-space data (detected radio frequency signal) according to conventional MRI techniques that are well known to those skilled in the art.

An image construction processor 7 implements processing operations according to the invention in order to generate an image I of a subject 5 arranged in the area of interest. The magnitude and/or phase image I thus generated may be displayed on the screen 8, for example to a doctor. Several images I may be generated over time, making it possible to obtain a series of MRI images.

In known manner, the k-space data acquired by each antenna Aj (j=1 . . . Nc, where Nc is the number of antennas) are converted in the spatial space (using a Fourier transform). The complex data thus obtained are complex spatial data, denoted pj(x,y,z) in each point P(x,y,z) of the volume of interest.

Still in a known manner, the spatial data pj(x,y,z) obtained using each antenna Aj may be realigned in the same frame of reference (X,Y,Z), so that two pixels p1(x,y,z) and p2(x,y,z) obtained using two antennas $A_1$ and $A_2$ and having the same coordinates (x,y,z) in this frame of reference, correspond to the same point P(x,y,z) of the volume of interest. The volume image data pj(x,y,z) obtained may be processed in slices, in which case one of the dimensions takes a fixed value for each slice (for example z=z0, z1, z2, . . . , zN, where N+1 is the number of slices).

For the rest, pI(x,y,z) designates the data of the constructed image I for the point P(x,y,z) from the various acquired image data.

Figure 2:
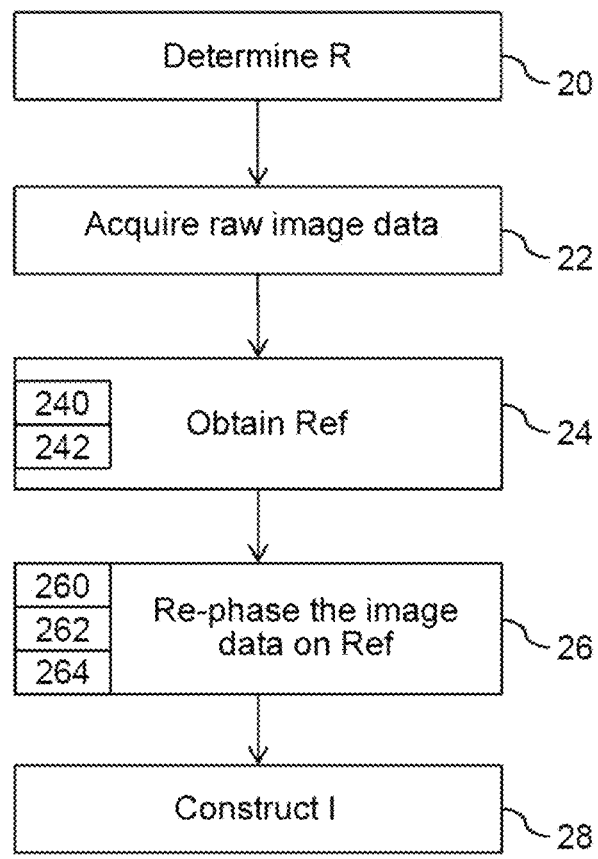
FIG. 2 illustrates, with the help of a flowchart, the general steps of generating an embodiment of an image according to the invention.

Using a flowchart, FIG. 2 illustrates the general steps of an embodiment generating an image I of the subject 5 by the image construction processor 7 at a current acquisition instant t. All or some of these steps may be repeated at subsequent acquisition times, in order to form a time series of MRI images.

The initial step 20 consists in determining a noise covariance matrix for the antenna array $A_1$-$A_{Nc}$. This symmetric matrix of size Nc×Nc, denoted R, represents the noise coupling between the individual antennas, and therefore the influence of the antennas Aj with regard to each other.

A single covariance matrix may be determined for all the points P(x,y,z) of the volume of interest observed. Of course, other approaches may be implemented, in particular an automatic and periodic reassessment of the matrix R, for example if an acquisition is prolonged over time.

Ri,j denotes the element of R in column i and row j(i,j∈[1 . . . Nc]). Ri,i is the diagonal element of position i, corresponding to the antenna Ai, i.e. the variance of Ai.

Step 20 may be performed at the startup of the system 1 or, preferably, before each imaging session is performed (i.e. before the series of data acquisitions in k-space for a patient in response to an MRI excitation sequence).

The covariance matrix R is estimated from a noise acquisition only: the radio frequency excitation and/or the magnetic field gradients are deactivated and the MRI system acquires noise samples to estimate the noise on each antenna $A_j$. A correlation between these noises may be estimated and transcribed in the form of a covariance matrix. Thus, the covariance matrix R represents a measurement by each antenna $A_i$, of thermal and/or electronic noise due to the other antennas $A_j$ (for the non-diagonal elements of the matrix), or due to the antenna $A_i$ itself (for diagonal elements). Those skilled in the art know many techniques for determining the covariance matrix or matrices R of an antenna array.

In practice, as MRI systems are not perfect, the covariance matrix (and therefore its inverse or pseudo-inverse matrix) comprises non-diagonal elements which are non-zero.

Step 20 is followed by step 22 during which the MRI system 1 acquires raw data (k-space data) of the area of interest (in which a patient has been placed, for example), transforms them into the spatial domain to obtain raw spatial data. This acquisition of raw spatial data of the subject uses each RF receiving antenna (at acquisition time t), wherein this data, being of complex values, makes it possible to obtain a plurality of images (2D or 3D) parallel to the explored area.

We denote by $p_j$, the raw spatial image data thus obtained using the antenna $A_j(j \in [1 \ldots Nc])$. These data may be volumetric: pj(x,y,z) for each point P(x,y,z) of the volume of interest, or may two-dimensional, for example within a slice $(z=z_t)$ of the volume of interest 5: pj(x,y)=pj(x,y,zt).

Steps 24 and 26 are optional, meaning that step 28 described below may be applied directly to the raw image data obtained in step 22.

In step 24, a reference antenna, denoted Ref, is determined. This reference antenna will be used, as described below, to re-phase the various raw image data obtained so that they are de-correlated to the maximum of the inherent sensitivity of their respective antennas.

Step 24 may simply consist in taking one of said antennas Aj which is sensitive over the whole of a volume of interest formed by the subject.

However, one variant considered consists in forming a virtual antenna by linear combination of said antennas Aj of the MRI system 1: $Ref = \sum_{j=1}^{N_c} w_j p_j$ where $w_j$ is a weight assigned to the antenna Aj in the linear combination so as to rotate each data $p_j$ in a privileged direction, and to normalize the reference antenna (|Ref|=1, for example, which allows the multiplication of the data by Ref without modifying the magnitude of the data).

It is then a question of determining the raw virtual spatial data (for each point P(x,y,z)) which correspond to this virtual antenna, in order to use them to re-phase the raw spatial data obtained using each physical antenna Aj.

In an embodiment with a virtual reference antenna, step 24 comprises a first sub-step 240 for correcting the phases of the complex image data obtained. The purpose of this step is to standardize each channel in terms of phase.

As described in the publication "Phase Reconstruction from Multiple Coil Data Using a Virtual Reference Coil" by Parker et al., this correction may consist, for example, in choosing a phase offset that cancels the data phase pj obtained upon using each antenna Aj at the same point $P_0(x_0,y_0,z_0)$. Thus, we subtract said correction thus determined from the data pj, so that the data pj of several, if not all, the antennas have the same phase value (preferably zero) in the same pixel.

This correction of the data pj is here carried out independently of the other antennas, through weighting coefficients of the antennas chosen appropriately on the basis of complex image data obtained using said antenna only: the correction $\varphi_j$ used for $A_j$ may be, for example, the argument of $p_j(x_0, y_0, z_0)$:

$$\varphi_j = \arg(p_j(x_0, y_0, z_0)).$$

The subtraction o this correction from the acquired data makes it possible to obtain a corrected signal $\tilde{p}_j$:

$$\tilde{p}_j(x,y,z) = p_j(x,y,z) \cdot e^{-i\varphi_j}$$

If the antennas do not overlap sufficiently in the volume of interest, this approach must be daisy chained between a first sub-volume where certain antennas have a common point $P_0$, or cancel, for example, the phase of the complex data obtained, then a second sub-volume where certain antennas have another common point $P_1$ where the phase of the complex data obtained will take a precise value. This precise value may be given, for example, by the value at point $P_1$ of an image belonging to the two sub-volumes, the phase of which has already been canceled in $P_0$.

A preferred correction variant is not dependent on the degree of overlap of the antennas. In this variant, the correction is carried out by subtracting, from the complex image data obtained using an antenna, the phase from the sum of the complex image data obtained using said antenna.

In other words, we first calculate the sum $S_j$ of the complex data of an image: $S_j = \sum_{x,y,z} p_j(x,y,z)$ where the volume covered (x,y,z) corresponds to the observation volume (which may be reduced to an area in the case of 2D images).

We extract the phase $\varphi_j$ from this sum: $\varphi_j = \arg(S_j)$

Then we subtract this corrective phase $\varphi_j$ from each raw datum acquired so as to obtain the corrected data: $\tilde{p}_j(x,y,z) = p_j(x,y,z) \cdot e^{-i\varphi_j}$.

This correction 240 is carried out on each set of raw data $p_j$, obtained using an antenna $A_j$.

Step 242 then calculates the reference antenna Ref for the current instant t, by linear combination of the antennas $A_j$. In particular, the linear combination may include a weighting of the corrected data $\tilde{p}_j$, as a function of the magnitude of the set of data $p_j$ obtained, for example a weighting by the inverse of the sum of the modules of the $p_j$.

Thus, $$Ref = \sum_{j=1}^{N_c} \frac{1}{\sum_{k=1}^{N_c} |p_k|} \tilde{p}_j,$$

where |·| is the absolute value function (or module for complex numbers).

Using the coordinates of each pixel:

$$Ref(x,y,z) = \sum_{j=1}^{N_c} \frac{\tilde{p}_j(x,y,z)}{\sum_{k=1}^{N_c} |p_k(x,y,z)|}$$

Advantageously, the reference antenna Ref may be determined once and then stored in memory for a series of measurements (step 22 repeated at different consecutive times of the same subject explored, or even with a new subject). The reference antenna may, in particular, be re-determined each time parameters of the MRI sequence are modified.

Following step 24, step 26 consists in the image construction processor 7 re-phasing the raw image data acquired with respect to the determined reference antenna Ref, so that their phases no longer depend on the sensitivity specific to their corresponding antennas Aj. During this step, provision may therefore be made to replace, in each complex image datum obtained using an antenna, a phase component specific to the antenna by a phase component of the reference antenna corresponding to the same spatial position as the complex image data.

This operation may be carried out in several sub-steps.

In sub-step 260, a phase difference δj(x,y,z) between a complex image datum pj(x,y,z) obtained and a corresponding complex datum (namely with the same coordinates) generated for the reference antenna Ref(x,y,z), is calculated:

$$\delta j(x,y,z) = \arg(pj(x,y,z)) - \arg(\text{Ref}(x,y,z)).$$

In sub-step 262, this phase difference is filtered to remove the noise-related phase components. As the noise is not correlated between pixels in the acquired data, unlike the sensitivity of the antennas, a low-pass filter (in the frequency domain of the images) is used. As an example, a filter of the 3D Hanning type may be used to acquire three-dimensional data (therefore when δj(x,y,z) is three-dimensional) or a filter of the 2D Hanning type with two-dimensional data (δj(x,y) is 2D). A 2D Hanning filter may also be used for three-dimensional data. For example, δj(x,y,z) is then "cut" into slices (2D), for example by fixing the constant z, then each 2D slice is transformed in the frequency domain (using a Fourier transform) before applying the Hanning filter to it. The result is reconverted in the spatial domain.

Alternatively, a filter as discussed in the publication "Combination of signals from array coils using image-based estimation of coil sensitivity profiles" (Bydder et al., Magn Reson Med 2002; 47: 539-548) may be used.

We denote the filtering as <·>. Thus, we obtain <δj(x,y,z)> the filtered phase difference.

In sub-step 264, this filtered phase difference is subtracted from the phase of the complex image datum considered: arg(pj(x,y,z))−<δj(x,y,z)>.

This thus gives processed complex data $\hat{p}_j(x,y,z)$ for each antenna Ai:

$$\hat{p}_j(x,y,z) = p_j(x,y,z) \cdot e^{-i(\delta j(x,y,z))}$$

It is this operation which substitutes the sensitivity phase components of the different measurement antennas $A_j$ with the same phase component specific to the reference antenna.

Then follows the generation of an image I of subject 5 by summing the data $\hat{p}_j(x,y,z)$ by weighting the latter using only the diagonal elements of the covariance matrix R, or of its matrix (pseudo) inverse $R^{-1}$. (i.e. without the help of the other non-diagonal coefficients of these matrices of which all or part are non-zero).

In particular, either the weight used is proportional, even equal, to the inverse of the diagonal element of R, or it is proportional, even equal, to the suitable diagonal element of R−1:

$$p_I(x, y, z) = \sum_{j=1}^{N_c} \frac{1}{R_{j,j}(x, y, z)} \cdot \hat{p}_j(x, y, z)$$

when the covariance matrix R is used;

$p_I(x,y,z) = \sum_{j=1}^{N_c} R_{j,j}^{-1}(x,y,z) \cdot \hat{p}_j(x,y,z)$ when the inverse (or pseudo-inverse) matrix $R^{-1}$ is used.

This is the final step 28.

In this summation formula, each complex image datum obtained is weighted by the inverse of the diagonal element of the covariance matrix corresponding to the antenna using which the complex data was obtained, or by the diagonal element of the covariance (pseudo) inverse matrix corresponding to the same antenna.

The signal $p_I$ thus generated is complex, making it possible to construct a magnitude image of the area explored and/or a phase image of this same area.

This summation according to the invention is of low computational complexity (compared to the solution described in Parket et al., For example, for a significant improvement in the quality of the images constructed (compared to the solutions of MRI machine manufacturers depending on a simple unweighted summation of the images obtained using the different antennas, for example).

Figure 3:
FIG. 3 illustrates the MRI images generated by the implementation of the invention (FIG. 3 bottom) compared to MRI images generated using conventional reconstruction techniques by Sum of Squares (SoS) (FIG. 3 top).
Figure 3:
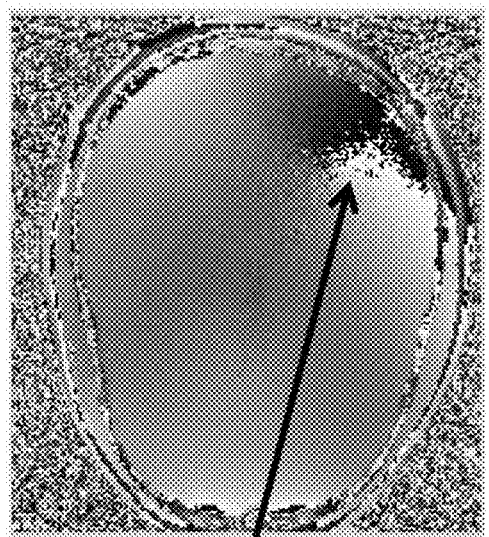
Figure 3:
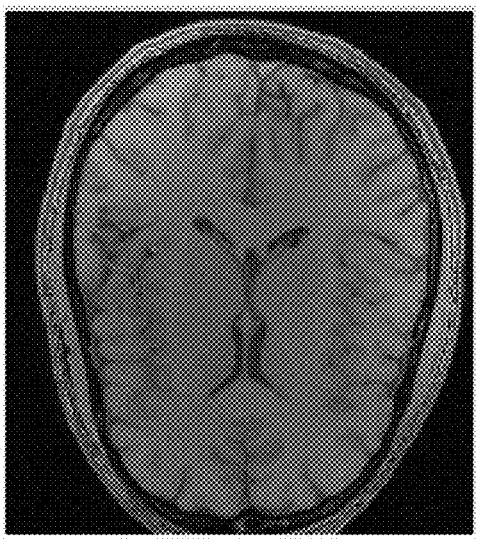
Figure 3:
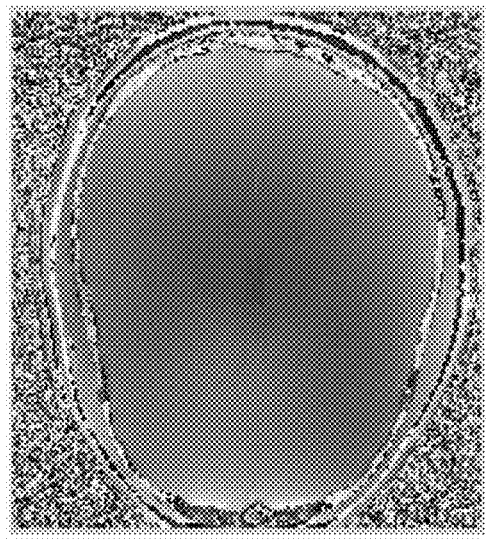

FIG. 3 illustrates the MRI images generated by the implementation of the invention using the inverse of the diagonal of the covariance matrix elements R (FIG. 3 bottom) compared to MRI images generated using conventional techniques sum by reconstruction squares, known by the abbreviation SoS (FIG. 3 top).

In the phase image (on the right), the artifacts conventionally observed are deleted, including the branch line artifacts, open-ended fringe lines, and phase discontinuities (see arrow F1).

Surprisingly, although the embodiments described above seek first to improve the phase image, the inventor has found that the magnitude image (on the left) is also clearly improved when the final summation 28 uses only the diagonal coefficients of the covariance matrix R (here), or of its inverse matrix $R^{-1}$. In particular, when the inverses of the diagonal elements of the matrix R are used, the inventor has observed a variation in intensity which is smaller, therefore beneficial, in the magnitude images.

While, traditionally, the MRI signal is concentrated on the parts close to the antennas (usually the cortex of a brain imaging) and quickly collapses in the center of the explored area (see image top left), the implementation of the invention makes it possible to correct biases in the image. The contrast in the center of the explored area (far from the antennas) is enhanced (see image bottom left), even though the sensitivity profile of the antennas may be unknown.

The foregoing examples are only embodiments of the invention which is not limited thereto.

The invention claimed is:

1. Method for generating an image of a subject using a system of nuclear magnetic resonance imaging (MRI) comprising a plurality of radio frequency receiving antennas, wherein the method comprises the following steps:
    obtaining complex image data of the subject using each antenna,
    obtaining a noise covariance matrix comprising one or more non-zero non-diagonal coefficients from said plurality of radio frequency receiving antennas, and
    generating an image of the subject by summing the complex image data obtained using different antennas by weighting the complex image data using only diagonal elements of the noise covariance matrix or its inverse or pseudo-inverse matrix, wherein each complex datum image obtained using an antenna is weighted by a diagonal element of the noise covariance matrix or its inverse or pseudo-inverse matrix corresponding to the antenna.

2. Method according to claim 1, wherein the step of obtaining complex image data comprises the steps of:
    determining a reference antenna, and replacing, in each complex image datum obtained using an antenna, a phase component specific to the antenna by a phase component of the reference antenna at the same spatial position as the complex image data.

3. Method according to claim 2, wherein the reference antenna is a virtual antenna formed by linear combination of said plurality of radio frequency receiving antennas of the MRI system.

4. Method according to claim 3, wherein the determination by linear combination comprises a correction of phases of the complex image data.

5. Method according to claim 4, wherein the correction of complex image data obtained using an antenna is carried out independently of the other antennas, using antenna weighting coefficients chosen from the complex image data obtained using only said antenna.

6. Method according to claim 4, wherein the correction comprises subtracting, from the complex image data obtained using said antenna, the phase of the sum of the complex image data obtained using said antenna.

7. Method according to claim 4, wherein the linear combination is obtained by weighting the complex corrected image data as a function of the magnitude of the complex image data.

8. Method according to claim 2, wherein the replacing step comprises applying a low-pass filter to a phase difference between a complex image datum obtained using an antenna and corresponding complex data obtained for the reference antenna, and subtracting a filtered phase difference from the phase component specific to the antenna.

9. Method according to claim 1, wherein the image of the subject is a magnitude image or a phase image or an image with complex values.

10. Nuclear magnetic resonance imaging (MRI) system comprising a plurality of radio frequency receiving antennas and at least one processor configured to:
    obtain a complex data image of a subject using each antenna,
    obtain a noise covariance matrix of each antenna, wherein the noise covariance matrix comprises one or more non-zero non-diagonal coefficients,
    and
    generate an image of the subject by summing the complex image data obtained using different antennas by weighting the complex image data using only diagonal elements of the noise covariance matrix or its inverse or pseudo-inverse matrix, wherein each complex image datum obtained using an antenna is weighted by a diagonal element of the noise covariance matrix or its inverse or pseudo-inverse matrix corresponding to the antenna.

* * * * *